(12) United States Patent
Kitagawa et al.

(10) Patent No.: US 10,497,603 B2
(45) Date of Patent: Dec. 3, 2019

(54) ELECTRONIC COMPONENT SUPPLY BODY AND METHOD FOR MANUFACTURING THE SAME

(71) Applicant: Murata Manufacturing Co., Ltd., Nagaokakyo-shi, Kyoto-fu (JP)

(72) Inventors: Sachio Kitagawa, Nagaokakyo (JP); Hiroyoshi Nakagawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 559 days.

(21) Appl. No.: 15/231,892

(22) Filed: Aug. 9, 2016

(65) Prior Publication Data

US 2016/0351433 A1 Dec. 1, 2016

Related U.S. Application Data

(63) Continuation of application No. PCT/JP2014/079091, filed on Oct. 31, 2014.

(30) Foreign Application Priority Data

Feb. 21, 2014 (JP) ................................ 2014-031751

(51) Int. Cl.
  *H01L 21/683* (2006.01)
  *C09J 5/00* (2006.01)
(52) U.S. Cl.
  CPC ............ *H01L 21/6836* (2013.01); *C09J 5/00* (2013.01); *C09J 2203/10* (2013.01); *C09J 2203/326* (2013.01); *H01L 2221/68327* (2013.01)
(58) Field of Classification Search
  CPC ....... C09J 5/006; C09J 7/22; C09J 7/38; C09J 2203/10; C09J 2203/326; C09J 2423/006;
  (Continued)

(56) References Cited

U.S. PATENT DOCUMENTS

2011/0088756 A1* 4/2011 Fujii ..................... H01L 31/048
  136/251

FOREIGN PATENT DOCUMENTS

JP  S61274336 A  12/1986
JP  2006222119 A  8/2006
  (Continued)

OTHER PUBLICATIONS

International Search Report issued for PCT/JP2014/079091, dated Jan. 27, 2015.

(Continued)

*Primary Examiner* — Brigitte A Paterson
(74) *Attorney, Agent, or Firm* — Arent Fox LLP

(57) ABSTRACT

An electronic component supply body and a method for manufacturing the same, which can suppress generation of wrinkles of an adhesive sheet and is unlikely to cause pickup failure of electronic component chips to occur. The supply body includes an adhesive sheet with an adhesive layer formed with an ultraviolet-curing adhesive, a ring frame bonded onto the adhesive sheet, and electronic component chips bonded onto a first region on the adhesive sheet superimposed with the opening of the ring frame. The second cured portions that are cured by being irradiated with ultraviolet rays are provided in a part of a second region forming a bonded portion between the adhesive sheet and the ring frame. Adhesive strength in the second cured portions in a shearing direction is larger than adhesive strength in a portion of the second region other than the second cured portions.

17 Claims, 4 Drawing Sheets

(58) Field of Classification Search
CPC ........... H01L 21/6836; H01L 21/67132; H01L 2221/68327
See application file for complete search history.

(56) References Cited

FOREIGN PATENT DOCUMENTS

| | | | |
|---|---|---|---|
| JP | 2010182777 | A | 8/2010 |
| JP | 2010219358 | A | 9/2010 |
| JP | 2013093519 | A | 5/2013 |
| JP | 2013254819 | A | 12/2013 |

OTHER PUBLICATIONS

Written Opinion of the International Searching Authority issued for PCT/JP2014/079091, dated Jan. 27, 2015.

* cited by examiner

ELECTRONIC COMPONENT SUPPLY BODY AND METHOD FOR MANUFACTURING THE SAME

CROSS REFERENCE TO RELATED APPLICATIONS

The present application is a continuation of PCT/JP2014/079091 filed Oct. 31, 2014, which claims priority to Japanese Patent Application No. 2014-031751, filed Feb. 21, 2014, the entire contents of each of which are incorporated herein by reference.

FIELD OF THE INVENTION

The present invention relates to an electronic component supply body and a method for manufacturing the same, which are used for shipping and mounting electronic component chips such as semiconductor chips and piezoelectric elements.

BACKGROUND

Conventionally, an electronic component supply body in which a ring frame and a large number of electronic component chips are bonded onto an adhesive sheet has been widely used for shipping and mounting electronic component chips such as semiconductor chips and piezoelectric elements.

In the Patent Document 1 identified below, a ring-like frame for cutting with a dicing machine and a semiconductor wafer are bonded onto an adhesive sheet having an ultraviolet-curing adhesive layer. Then, the semiconductor wafer is pelletized to form a plurality of semiconductor chips. Subsequently, a site on the adhesive sheet onto which the frame for cutting with the dicing machine is bonded is shielded from light and a region thereof onto which the semiconductor chips are bonded is irradiated with ultraviolet rays. Adhesive strength between the adhesive sheet and the frame for cutting with the dicing machine is maintained because a bonded portion therebetween is shielded from light. However, adhesive force in a portion irradiated with the ultraviolet rays is decreased because the adhesive layer therein is cured. Therefore, the semiconductor chips can be easily separated in this design.

Patent Document 1: Japanese Unexamined Patent Application Publication No. 61-274336.

However, the method disclosed in Patent Document 1 causes the adhesive sheet to get wrinkled in some cases. Due to this effect, the semiconductor chips bonded onto the adhesive sheet can tilt randomly. As a result, they cannot be picked up by suction in some cases. In addition, in image recognition for picking up the semiconductor chips, false recognition may occur in some cases.

SUMMARY OF THE INVENTION

An object of the present disclosure is to provide an electronic component supply body and a method for manufacturing the same, which can suppress generation of wrinkles of an adhesive sheet and is unlikely to cause pickup failure of electronic component chips to occur.

An electronic component supply body as disclosed herein includes an adhesive sheet that has an adhesive layer formed with an ultraviolet-curing adhesive, a ring frame that is bonded onto the adhesive sheet and has an opening, and a plurality of electronic component chips that are bonded onto a first region on the adhesive sheet, which is superimposed with the opening of the ring frame. The adhesive sheet has a first cured portion that is cured by being irradiated with ultraviolet rays in at least a region in which the electronic component chips are bonded in the first region, and a plurality of second cured portions that are cured by being irradiated with the ultraviolet rays in a part of a second region forming a bonded portion between the adhesive sheet and the ring frame. In the second region, adhesive strength in the second cured portions in a shearing direction is made larger than adhesive strength in a portion other than the second cured portions.

In a specific aspect of the electronic component supply body disclosed herein, an entire portion of the first region on the adhesive sheet is the first cured portion.

In another specific aspect of the electronic component supply body disclosed herein, the adhesive layer is provided on only one surface of the adhesive sheet.

In still another specific aspect of the electronic component supply body disclosed herein, an outer circumferential edge of the adhesive sheet is located between an outer circumferential edge and an inner circumferential edge of the ring frame.

In still another specific aspect of the electronic component supply body disclosed herein, the plurality of second cured portions are dispersed along a circumferential direction of the ring frame.

A method for manufacturing an electronic component supply body according to another aspect includes preparing an adhesive sheet that has an adhesive layer formed with an ultraviolet-curing adhesive, a ring frame that has an opening, and an electronic component wafer or a plurality of electronic component chips, bonding the ring frame onto the adhesive sheet, bonding the electronic component wafer or the plurality of electronic component chips onto a first region on the adhesive sheet, which is superimposed with the opening of the ring frame, and irradiating the adhesive sheet with ultraviolet rays. In the irradiating of the adhesive sheet with the ultraviolet rays, at least a region in which the electronic component wafer or the plurality of electronic component chips are bonded in the first region and a part of a second region forming a bonded portion between the adhesive sheet and the ring frame are irradiated with the ultraviolet rays.

In a specific aspect of the method for manufacturing disclosed herein, the adhesive sheet is irradiated with the ultraviolet rays with a mask interposed between the adhesive sheet and the ultraviolet rays.

In another specific aspect of the method for manufacturing disclosed herein, the plurality of electronic component chips are bonded onto the first region.

In still another specific aspect of the method for manufacturing disclosed herein, the electronic component wafer is bonded onto the first region, and the method further including cutting the electronic component wafer into the plurality of electronic component chips with a dicing machine after bonding the electronic component wafer onto the adhesive sheet.

In still another specific aspect of the method for manufacturing disclosed herein, in the irradiating of the first region on the adhesive sheet with the ultraviolet rays, overall the first region is irradiated with the ultraviolet rays.

In still another specific aspect of the method for manufacturing disclosed herein, in the irradiating of the second region on the adhesive sheet with the ultraviolet rays, a plurality of positions which are dispersed along a circumferential direction of the ring frame are irradiated with the ultraviolet rays.

According to the present disclosure, an electronic component supply body and a method for manufacturing the same is provided that can suppress generation of wrinkles of an adhesive sheet and is unlikely to cause pickup failure of electronic component chips to occur.

DETAILED DESCRIPTION OF THE EMBODIMENTS

Hereinafter, the present invention will be made obvious by explaining specific embodiments of the present invention with reference to the drawings.

Figure 1A:
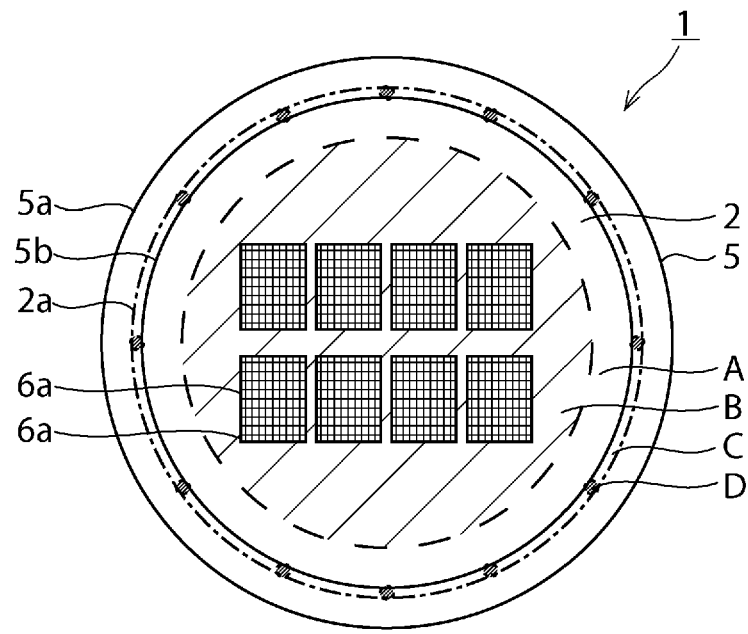
FIG. 1(a) and FIG. 1(b) are a plan view and a partial enlarged view illustrating an electronic component supply body according to a first embodiment of the present invention.
Figure 1B:
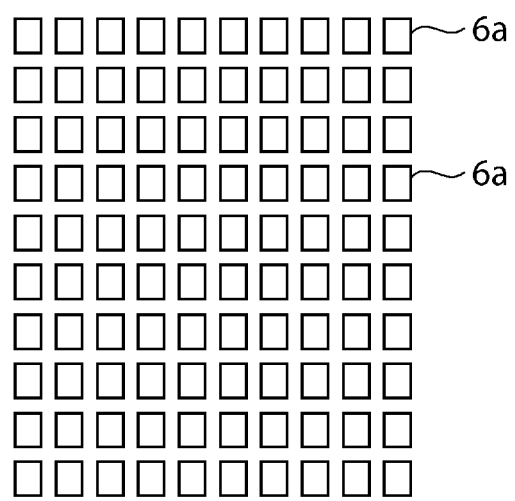
Figure 2:
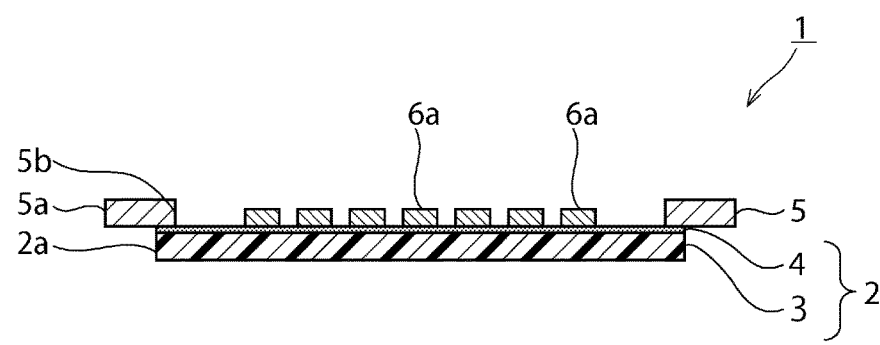
FIG. 2 is a front cross-sectional view illustrating the electronic component supply body in the first embodiment of the present invention.

FIG. 1(a) is a plan view illustrating an electronic component supply body according to a first embodiment of the present invention. FIG. 1(b) is a partial enlarged view illustrating the electronic component supply body in the first embodiment of the present invention. FIG. 2 is a front cross-sectional view illustrating the electronic component supply body in the first embodiment of the present invention.

An electronic component supply body 1 is provided that includes an adhesive sheet 2. The adhesive sheet 2 includes a base member 3. In the exemplary embodiment, the base member 3 is formed with polyolefin and has a thickness of 80 μm. However, it is noted that the base member 3 may be formed with appropriate resin other than polyolefin and that the thickness of the base member 3 is not particularly limited to the above-described value.

An adhesive layer 4 formed with an ultraviolet-curing adhesive is laminated on the base member 3. When the adhesive layer 4 is cured by being irradiated with ultraviolet rays, adhesive force thereof in the direction perpendicular to an adhesive surface is decreased. On the other hand, adhesive force thereof in the shearing direction as the direction parallel with the adhesive surface is increased. In the embodiment, the adhesive layer 4 is formed with acryl-based polymer and has a thickness of 10 μm. However, it is noted that the adhesive layer 4 may be formed with an ultraviolet-curing adhesive other than the acryl-based polymer and that the thickness of the adhesive layer 4 is not particularly limited to the above-described value.

In the exemplary embodiment, the adhesive layer 4 is provided on only one surface of the base member 3. However, the adhesive layers may be provided on both surfaces thereof.

A ring frame 5 having an opening is bonded to the adhesive sheet 2 at the adhesive layer 4 side. In the embodiment, the ring frame 5 is formed with nickel-plated stainless steel and has a thickness of approximately 1.2 mm. However, it is noted that the ring frame 5 may not be nickel-plated and may be formed with appropriate metal other than stainless steel or ceramics.

An outer circumferential edge 2a of the adhesive sheet 2 is located between an outer circumferential edge 5a and an inner circumferential edge 5b of the ring frame 5. However, in alternative embodiments, the outer circumferential edge 2a of the adhesive sheet 2 may be located at an outer side portion of the outer circumferential edge 5a of the ring frame 5.

A region on the adhesive sheet 2, which is superimposed with the opening of the ring frame 5, is formed as a first region A. In the first region A, a plurality of electronic component chips 6a are bonded. In the embodiment, the electronic component chips 6a are piezoelectric elements, although the electronic component chips 6a are not limited to the piezoelectric elements and may be other electronic component chips such as semiconductor chips.

In the adhesive sheet 2, the adhesive layer 4 is cured by being irradiated with the ultraviolet rays in at least a region in which the electronic component chips 6a are bonded in the first region A. With this, a first cured portion B is formed. The curing causes the adhesive force in the direction perpendicular to the adhesive surface to be decreased. In one aspect, the first cured portion B may comprises the entire portion of the first region A.

A bonded portion between the adhesive sheet 2 and the ring frame 5 forms a second region C. The adhesive layer 4 is cured by being irradiated with the ultraviolet rays in a part of the second region C. With this, second cured portions D can be formed. In the exemplary embodiment, the plurality of second cured portions D are dispersed at equal intervals along the circumferential direction of the ring frame 5. Furthermore, the respective second cured portions D are formed so as to reach the inner circumferential edge 5b of the ring frame 5 from the outer circumferential edge 2a of the adhesive sheet 2.

It is noted that the second cured portions D may not be arranged at equal intervals in an alternative embodiment. Moreover, the second cured portions D are not limited to a particular planar shape. For example, the planar shape of the second cured portions D may be a circular shape, a rectangular shape, a mesh-like shape, or the like. Furthermore, the respective second cured portions D may reach the inside of the first region A. Alternatively, the respective second cured portions D may be formed so as not to reach the inner circumferential edge 5b of the ring frame 5 from the outer circumferential edge 2a of the adhesive sheet 2.

By providing the electronic component supply body with the above-described second cured portions D, the disclosed supply body can suppress generation of wrinkles of the adhesive sheet. Accordingly, it is unlikely to cause pickup failure of the electronic component chips to occur. The following describes this point.

Figure 3:
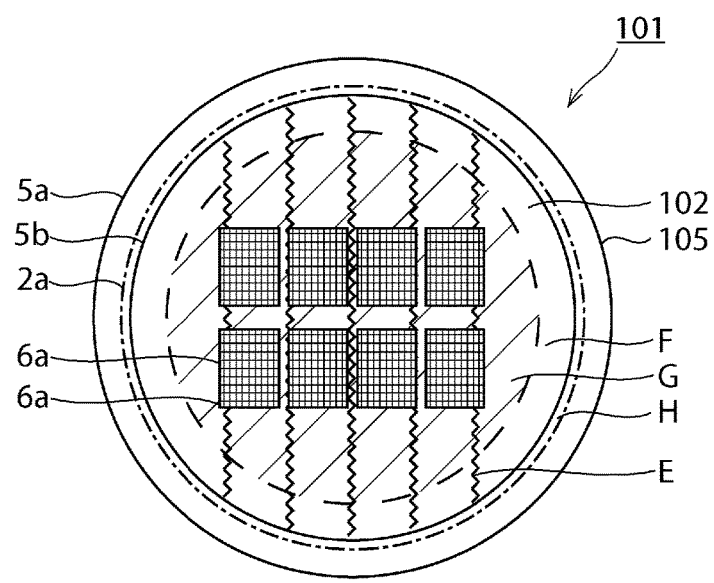
FIG. 3 is a plan view illustrating an electronic component supply body prepared for comparison.

FIG. 3 is a plan view illustrating an electronic component supply body prepared for comparison.

A plurality of wrinkles E are generated on an adhesive sheet 102. An electronic component supply body 101 includes no second cured portion. That is to say, in a second region H forming a bonded portion between the adhesive sheet 102 and a ring frame 105, no portion that is cured by being irradiated with ultraviolet rays is provided.

Figure 4:
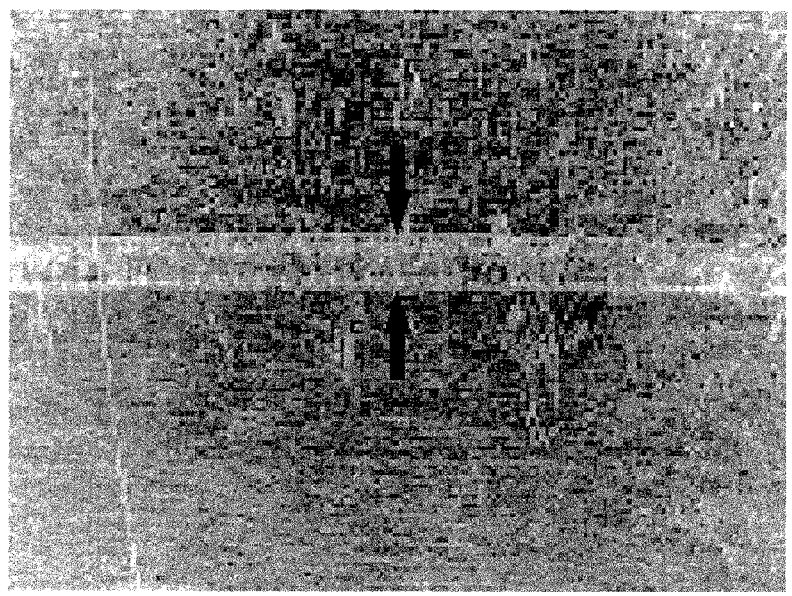
FIG. 4 is an enlarged photograph of a bonded surface between an adhesive sheet and a ring frame in the electronic component supply body prepared for comparison.

FIG. 4 is an enlarged photograph of the bonded surface between the adhesive sheet and the ring frame in the electronic component supply body prepared for comparison.

As shown, positional displacement occurs in the bonded surface between the adhesive sheet 102 and the ring frame 105. The adhesive sheet 102 contracts over time. The adhesive sheet 102 contracts regardless of provision of a first cured portion G in a first region F. When the adhesive sheet 102 contracts, shearing stress acts in the second region H. The shearing stress cannot be suppressed by adhesive force of the adhesive in the shearing direction in the second region H. Therefore, the positional displacement occurs in the bonded surface. The wrinkles E are generated because the above-described contraction of the adhesive sheet 102 cannot be suppressed.

In contrast, according to the exemplary embodiment, the electronic component supply body includes the plurality of second cured portions D. The adhesive layer 4 formed with the ultraviolet-curing adhesive is cured by being irradiated with the ultraviolet rays, thereby increasing the adhesive force in the shearing direction. Therefore, even when the shearing stress acts in the second region C, displacement of the bonded surface between the adhesive sheet 2 and the ring frame 5 is unlikely to occur.

Figure 5:
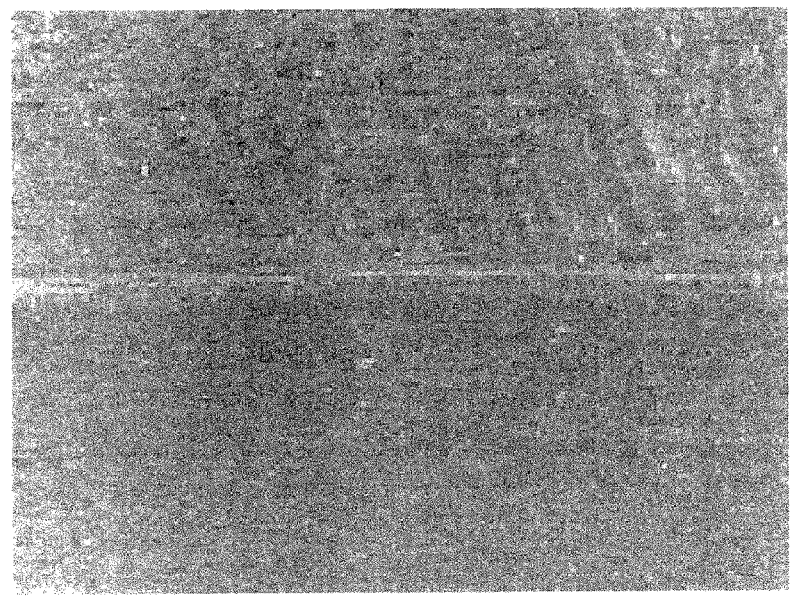
FIG. 5 is an enlarged photograph of a bonded surface between an adhesive sheet and a ring frame in the first embodiment of the present invention.

FIG. 5 is an enlarged photograph of the bonded surface between the adhesive sheet and the ring frame in the first embodiment of the present invention.

In the embodiment, it is seen that no positional displacement occurs in the bonded surface between the adhesive sheet 2 and the ring frame 5 and contraction of the adhesive sheet 2 can be suppressed. Accordingly, generation of wrinkles can be suppressed and it is unlikely to cause pickup failure of the electronic components to occur.

It is noted that the first cured portion B is cured by being irradiated with the ultraviolet rays, and the adhesive force in the direction perpendicular to the adhesive surface is thereby decreased. With this method, the electronic component chips 6a can be separated from the adhesive sheet 2 easily. Accordingly, the electronic component chips can be picked up easily and reliably.

Figure 6:
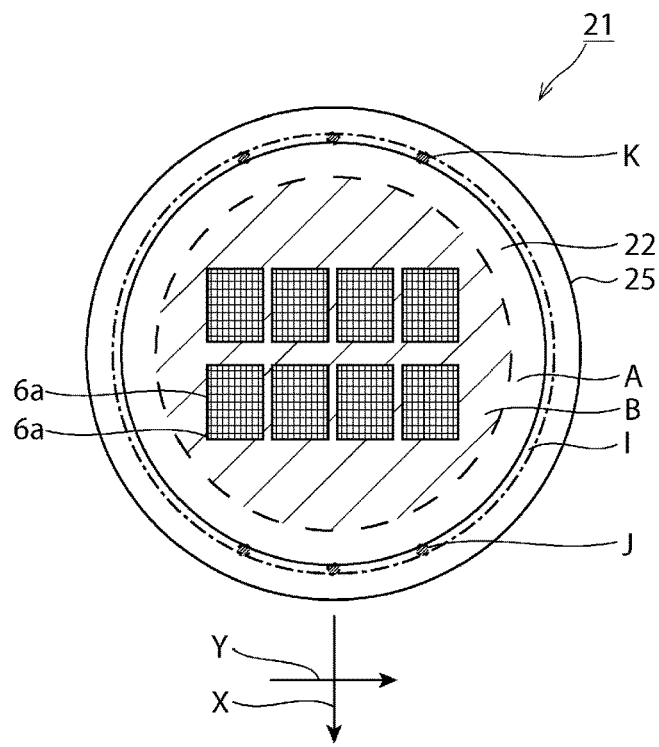
FIG. 6 is a plan view illustrating an electronic component supply body according to a second embodiment of the present invention.

FIG. 6 is a plan view illustrating an electronic component supply body according to a second embodiment of the present invention.

In general, the adhesive sheet is used while being drawn out from a roll. The draw-out direction from the roll is assumed to be X. A direction perpendicular to the X direction is assumed to be a Y direction.

A bonded portion between an adhesive sheet 22 and a ring frame 25 is a second region I. In an electronic component supply body 21, an adhesive layer is cured by being irradiated with ultraviolet rays in a part of the second region I. With this design, second cured portions J and K are formed. The plurality of second cured portions J and K are provided along the circumferential direction of the ring frame 25. Furthermore, the second cured portions J and the second cured portions K are provided so as to oppose each other in the X direction with an opening of the ring frame 25 interposed therebetween. The second cured portions J and K are dispersed such that the positions thereof in the Y direction are not biased. Other configurations thereof are the same as those in the first embodiment.

In general, the adhesive sheet is easy to get wrinkled in the direction parallel with the draw-out direction from a roll. That is to say, the adhesive sheet 22 is easy to get wrinkled in the X direction illustrated in FIG. 6. In addition, the adhesive sheet 22 is easy to contract in the Y direction illustrated in FIG. 6. The adhesive sheet 22 contracts in the Y direction at any sites in the Y direction. That is to say, when positions of the sites at which contraction of the adhesive sheet 22 can be suppressed are biased in the Y direction, the above-described effect of suppressing the contraction is lowered. In the embodiment, the second cured portions J and K are dispersed such that the positions thereof in the Y direction are not biased. Therefore, the above-described effect of suppressing the contraction of the adhesive sheet 22 in the Y direction can be enhanced. Accordingly, generation of the wrinkles of the adhesive sheet can be suppressed more effectively. It is therefore more unlikely to cause the pickup failure of the electronic component chips to occur.

Figure 7:
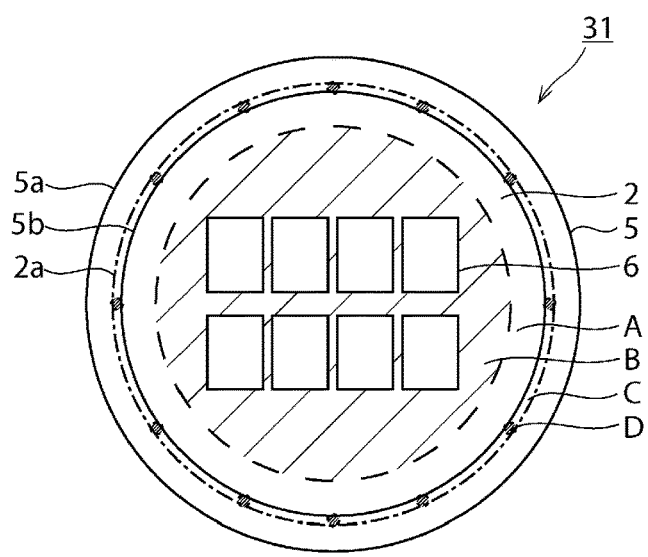
FIG. 7 is a plan view illustrating an electronic component supply body according to a variation of the present invention.

FIG. 7 is a plan view illustrating an electronic component supply body according to a variation of the present invention.

In an electronic component supply body 31, electronic component wafers 6 are bonded onto the adhesive sheet 2. The electronic component supply body 1 in which the plurality of electronic component chips 6a illustrated in FIG. 1 are formed by cutting the electronic component wafers 6 with a dicing machine may be configured.

Next, an example of a method for manufacturing the electronic component supply body in the first embodiment will be described.

The adhesive sheet 2 that has the adhesive layer 4 formed with the ultraviolet-curing adhesive, the ring frame 5 having the opening, and the electronic component wafers 6 are prepared.

Then, the ring frame 5 is bonded onto the adhesive sheet 2. Subsequently, the electronic component wafers 6 are bonded onto the adhesive sheet 2 in the first region A.

Thereafter, the electronic component wafers 6 are cut by a dicing machine so as to provide the plurality of electronic component chips 6a. It is noted that the plurality of electronic component chips 6a may be previously prepared and bonded to the adhesive sheet 2.

Subsequently, the adhesive sheet 2 is irradiated with the ultraviolet rays with a mask interposed therebetween. In this case, at least a region in which the electronic component wafers 6 are bonded in the first region A is irradiated with the ultraviolet rays. With this, the first cured portion B is formed in the first region A. It should be noted that overall the first region A may be irradiated with the ultraviolet rays.

Furthermore, a part of the second region C as the bonded portion between the adhesive sheet 2 and the ring frame 5 is also irradiated with the ultraviolet rays. With this step, the second cured portions D are formed in the second region C. When the second region C is irradiated with the ultraviolet rays, a plurality of positions are irradiated with the ultraviolet rays along the circumferential direction of the ring frame 5.

It is further noted that in the irradiation of the adhesive sheet 2 with the ultraviolet rays, overall the surface may be collectively irradiated with the mask interposed therebetween. As another method, not overall the surface but a plurality of portions of all the portions may be irradiated at the same time and irradiation may be repeated while changing portions to be irradiated with the ultraviolet rays. Alternatively, the irradiation may be performed for each portion. Moreover, when a size of a region that is irradiated with the ultraviolet rays is larger than a region that is irradiated with the ultraviolet rays at a time, the region may be irradiated with the ultraviolet rays with no mask interposed therebetween.

REFERENCE SIGNS LIST

1 ELECTRONIC COMPONENT SUPPLY BODY
2 ADHESIVE SHEET
2a OUTER CIRCUMFERENTIAL EDGE
3 BASE MEMBER
4 ADHESIVE LAYER
5 RING FRAME
5a OUTER CIRCUMFERENTIAL EDGE
5b INNER CIRCUMFERENTIAL EDGE
6 ELECTRONIC COMPONENT WAFER
6a ELECTRONIC COMPONENT CHIP
21 ELECTRONIC COMPONENT SUPPLY BODY
22 ADHESIVE SHEET
25 RING FRAME
31 ELECTRONIC COMPONENT SUPPLY BODY
101 ELECTRONIC COMPONENT SUPPLY BODY
102 ADHESIVE SHEET
105 RING FRAME

The invention claimed is:

1. An electronic component supply body comprising:
an adhesive sheet having an adhesive layer; and
a ring frame bonded to the adhesive sheet with an opening therein, with the adhesive sheet completely extending in the opening defined by the ring frame,
wherein the adhesive sheet has a first region disposed at least within the opening of the ring frame and at least part of the first region includes a first cured portion,
wherein a bonded portion between the adhesive sheet and the ring frame forms a second region that includes a plurality of second cured portions dispersed in the second region, and
wherein an adhesive strength in the second cured portions in a shearing direction is greater than an adhesive strength in portions of the second region other than the second cured portions.

2. The electronic component supply body according to claim 1, wherein the adhesive layer comprises an ultraviolet-curing adhesive.

3. The electronic component supply body according to claim 1, wherein the adhesive sheet includes an outer circumferential edge that is positioned between an outer circumferential edge and an inner circumferential edge of the ring frame.

4. The electronic component supply body according to claim 1, wherein the plurality of second cured portions are dispersed along a circumference of the ring frame.

5. The electronic component supply body according to claim 4, wherein the plurality of second cured portions are dispersed at equal intervals in the second portion.

6. The electronic component supply body according to claim 1, further comprising a plurality of electronic component chips bonded to the first region of the adhesive sheet.

7. The electronic component supply body according to claim 6, wherein the first region is superimposed with the opening of the ring frame.

8. The electronic component supply body according to claim 7, wherein the first region on the adhesive sheet comprises an entire part of the first cured portion.

9. The electronic component supply body according to claim 6, wherein the first cured portion is cured by being irradiated with ultraviolet rays in at least a region in which the electronic component chips are bonded in the first region.

10. The electronic component supply body according to claim 9, wherein the plurality of second cured portions are cured by being irradiated with the ultraviolet rays.

11. The electronic component supply body according to claim 1, wherein the adhesive layer is disposed on only one surface of the adhesive sheet.

12. An electronic component supply body comprising:
an adhesive sheet having an adhesive layer;
a plurality of electronic component chips bonded to a first region of the adhesive sheet; and
a ring frame bonded to the adhesive sheet with an opening therein,
wherein the first region of the adhesive sheet is disposed at least within the opening of the ring frame and at least part of the first region includes a first cured portion,
wherein a bonded portion between the adhesive sheet and the ring frame forms a second region that includes a plurality of second cured portions dispersed in the second region, and
wherein an adhesive strength in the second cured portions in a shearing direction is greater than an adhesive strength in portions of the second region other than the second cured portions.

13. The electronic component supply body according to claim 12, wherein the first region is superimposed with the opening of the ring frame.

14. The electronic component supply body according to claim 13, wherein the first region on the adhesive sheet comprises an entire part of the first cured portion.

15. The electronic component supply body according to claim 12, wherein the first cured portion is cured by being irradiated with ultraviolet rays in at least a region in which the electronic component chips are bonded in the first region.

16. The electronic component supply body according to claim 15, wherein the plurality of second cured portions are cured by being irradiated with the ultraviolet rays.

17. An electronic component supply body comprising:
an adhesive sheet having an adhesive layer; and
a ring frame bonded to the adhesive sheet with an opening therein,
wherein the adhesive sheet has a first region disposed at least within the opening of the ring frame and at least part of the first region includes a first cured portion,
wherein a bonded portion between the adhesive sheet and the ring frame forms a second region that includes a plurality of second cured portions dispersed in the second region,
wherein an adhesive strength in the second cured portions in a shearing direction is greater than an adhesive strength in portions of the second region other than the second cured portions, and
wherein the adhesive layer is disposed on only one surface of the adhesive sheet.

* * * * *